(12) United States Patent
Chen

(10) Patent No.: US 7,963,678 B2
(45) Date of Patent: Jun. 21, 2011

(54) SEMICONDUCTOR LIGHT-EMITTING APPARATUS INTEGRATED WITH HEAT-CONDUCTING/DISSIPATING MODULE

(75) Inventor: Jen-Shyan Chen, Hsinchu (TW)

(73) Assignee: Neobulb Technologies, Inc. (BN)

( * ) Notice: Subject to any disclaimer, the term of this patent is extended or adjusted under 35 U.S.C. 154(b) by 565 days.

(21) Appl. No.: 11/921,464

(22) PCT Filed: Jun. 13, 2005

(86) PCT No.: PCT/CN2005/000838
§ 371 (c)(1),
(2), (4) Date: Dec. 3, 2007

(87) PCT Pub. No.: WO2006/128327
PCT Pub. Date: Jul. 12, 2006

(65) Prior Publication Data
US 2009/0225540 A1 Sep. 10, 2009

(30) Foreign Application Priority Data

Jun. 3, 2005 (CN) .......................... 2005 1 0074776

(51) Int. Cl.
*F21V 29/00* (2006.01)
(52) U.S. Cl. .................. 362/294; 362/373; 362/249.02; 362/249.01
(58) Field of Classification Search .................. 362/294, 362/345, 373, 800, 96, 264, 580, 547, 249.01, 362/249.02; 165/80.2, 80.3, 80.4
See application file for complete search history.

(56) References Cited

U.S. PATENT DOCUMENTS

| 6,465,961 | B1 | 10/2002 | Cao |
| 6,640,888 | B1 * | 11/2003 | Horng et al. .................. 165/185 |
| 6,897,486 | B2 | 5/2005 | Loh |
| 7,083,305 | B2 | 8/2006 | Galli |

(Continued)

FOREIGN PATENT DOCUMENTS

CN 1359137 A 12/2001

(Continued)

OTHER PUBLICATIONS

International Search Report of PCT/CN2005/000838 mailed Mar. 16, 2006.

*Primary Examiner* — Evan Dzierzynski
(74) *Attorney, Agent, or Firm* — Thomas, Kayden, Horstemeyer & Risley, LLP.

(57) ABSTRACT

The invention relates to a light-emitting apparatus. The light-emitting apparatus includes a heat-conducting/dissipating module and at least one semiconductor light-emitting module. The heat-conducting/dissipating module includes a substantially cylindrical heat-conducting device having at least one flat portion and at least one heat-dissipating fin mounted on the circumference of the heat-conducting device. The at least one semiconductor light-emitting module includes a carrier, a plurality of exterior electrodes, at least one semiconductor light-emitting die, and at least two conducting wires. The carrier is flatly mounted on the flat portion of the heat-conducting device. The plurality of exterior electrodes is disposed on the carrier. The at least one semiconductor light-emitting die is mounted on the carrier and respectively connected to the plurality of exterior electrodes. The at least two conducting wires are connected to a power source or a grounding by being electrically connected to the plurality of exterior electrodes.

22 Claims, 7 Drawing Sheets

U.S. PATENT DOCUMENTS

| | | |
|---|---|---|
| 7,093,958 B2 * | 8/2006 | Coushaine .................... 362/294 |
| 7,331,691 B2 * | 2/2008 | Livesay et al. ................ 362/294 |
| 2004/0256630 A1 * | 12/2004 | Cao ................................. 257/98 |
| 2005/0231983 A1 | 10/2005 | Dahm |
| 2005/0279949 A1 | 12/2005 | Oldham et al. |
| 2006/0092639 A1 | 5/2006 | Livesay et al. |
| 2006/0100496 A1 | 5/2006 | Avron |
| 2007/0285926 A1 * | 12/2007 | Maxik ........................... 362/294 |

FOREIGN PATENT DOCUMENTS

| | | |
|---|---|---|
| CN | 2564849 Y | 8/2002 |
| CN | 2644878 Y | 8/2003 |
| CN | 2677742 Y | 1/2004 |
| CN | 2685703 Y | 2/2004 |
| CN | 1605795 A | 10/2004 |
| TW | 549590 | 10/2002 |

* cited by examiner

SEMICONDUCTOR LIGHT-EMITTING APPARATUS INTEGRATED WITH HEAT-CONDUCTING/DISSIPATING MODULE

BACKGROUND OF THE INVENTION

1. Field of the Invention

The present invention relates to a light-emitting apparatus; in particular, the light-emitting apparatus, according to the invention, integrates a heat-conducting/dissipating module.

2. Description of the Prior Art

Because light-emitting diodes have the many advantages, such as power-saving, shake-resistant, rapid-responding, and applicable to mass production, current lighting products applying light-emitting diodes as a light source are becoming more and more widely used. Currently, many manufacturers have invested in the manufacturing of high-brightness light-emitting diode packages with different appearances. These high-brightness light-emitting diode packages use a bigger emitter chip, thus having a higher power requirement. Although the high-brightness light-emitting diodes can generate a brightness output higher than that generated by the traditional light-emitting diodes, the high-brightness light-emitting diodes also generate a large amount of heat after continuous light emission for a period of time. The large amount of heat generated causes the problem of junction temperature being too high, leading to a decreased light-emitting efficiency of the light-emitting diodes that causes the brightness not being able to increase. Thus, different types of products applying the high-power light-emitting diodes all require a good additional heat-dissipating mechanism.

Referring to FIG. 1A and FIG. 1B, FIG. 1A is a schematic diagram of the light-emitting apparatus having a heat-dissipating module as an independent device according to prior art. FIG. 1B is a cross-sectional view of the light-emitting apparatus according to FIG. 1A. As shown in FIG. 1A and FIG. 1B, a semiconductor light-emitting module 4 includes a base plate 46 thereon having a slot 44 on which a plurality of chips 42 are disposed. The base plate 46 is made from a metal material, a ceramic material, or a polymeric material. The base plate 46 thereon has an insulating layer and a conducting layer. The conducting layer, overlaid on the insulating layer, is electrically connected to the plurality of chips 42. The heat generated by the plurality of chips 42 is conducted through the base plate 46 to reach a heat-dissipating module 5, which is usually a fin-shaped heat-dissipating plate. The heat generated by the plurality of chips 42 is conducted through multiple layers of materials, instead of being directly contacted to the heat-dissipating module 5 for heat dissipation. Thus, heat cannot be rapidly conducted away to be effectively dissipated, and the heat-dissipating efficiency of the chips cannot be precisely controlled either, due to the slow conduction of heat. In high-power applications, the junction temperatures of the light-emitting diode chips usually exceed the safety range. This type of heat-dissipating module cannot rapidly dissipate heat, and the heat-dissipating efficiency cannot be precisely controlled either. The high-power semiconductor light-emitting modules are especially prone to damages caused by overheating due to poor heat-dissipating efficiency.

Accordingly, a scope of the present invention is to provide a light-emitting apparatus capable of simultaneously including a high-brightness semiconductor light-emitting module and a good heat-conducting/dissipating module. The heat-conducting/dissipating module is capable of lowering the thermal resistance inside the layers of the packages to effectively lower the junction temperature of semiconductor chip and to provide a light-emitting effect with high brightness, in addition to resolving the aforementioned heat dissipation problems.

SUMMARY OF THE INVENTION

A scope of the invention is to provide a light-emitting apparatus. The light-emitting apparatus, according to the invention, includes a heat-conducting/dissipating module and at least one semiconductor light-emitting module.

The heat-conducting/dissipating module includes a substantially cylindrical heat-conducting device and at least one heat-dissipating fin. The heat-conducting device has at least one flat portion. The at least one heat-dissipating fin is mounted on a circumference of the heat-conducting device. The at least one semiconductor light-emitting module includes a carrier, a plurality of exterior electrodes, at least one semiconductor light-emitting die, and at least two conducting wires. The carrier is mounted flatly on the at least one flat portion of the heat-conducting device. The plurality of exterior electrodes is disposed on the carrier. The at least one semiconductor light-emitting die is disposed on the carrier and respectively electrically connected to the plurality of exterior electrodes. The at least two conducting wires are electrically connected to the exterior electrodes, so as to connect to a power source or a ground.

When the light-emitting apparatus is connected to a power source and emits light, the heat generated by the light-emitting apparatus is conducted through the at least one flat portion to the at least one heat-dissipating fin of the heat-conducting device, and the heat is then dissipated by the at least one heat-dissipating fin.

The light-emitting apparatus, according to the invention, effectively integrates the heat-conducting/dissipating module with the semiconductor light-emitting module into an independent light-emitting apparatus having a heat-dissipating function incorporated into a light engine with a heat-dissipating efficiency. The heat-conducting/dissipating module is capable of conducting the heat generated by the at least one semiconductor light-emitting module through the cylindrical heat-conducting apparatus. The heat-conducting apparatus not only has a larger surface area compared with that according to prior art, but is also capable of conducting the heat away from the semiconductor light-emitting module. Afterwards, each of the at least one heat-dissipating fins immediately dissipates the heat to the surrounding air to substantially increase the heat-dissipating efficiency. Thus, compared with prior art, the light-emitting apparatus, according to the invention, effectively lowers the junction temperature by laying the semiconductor light-emitting module flatly on the flat portion of the heat-conducting device, and it is more suitable for applications in the lighting devices requiring high-efficiency light-emitting diode chips.

The light-emitting apparatus, according to the invention, can integrate the current light-emitting diode module with the current heat-conducting/dissipating module into an independent device that is capable of conducting heat effectively and has a better heat-dissipating efficiency. The advantage and spirit of the invention may be understood by the following recitations together with the appended drawings.

BRIEF DESCRIPTION OF THE APPENDED DRAWINGS

Figure 5:
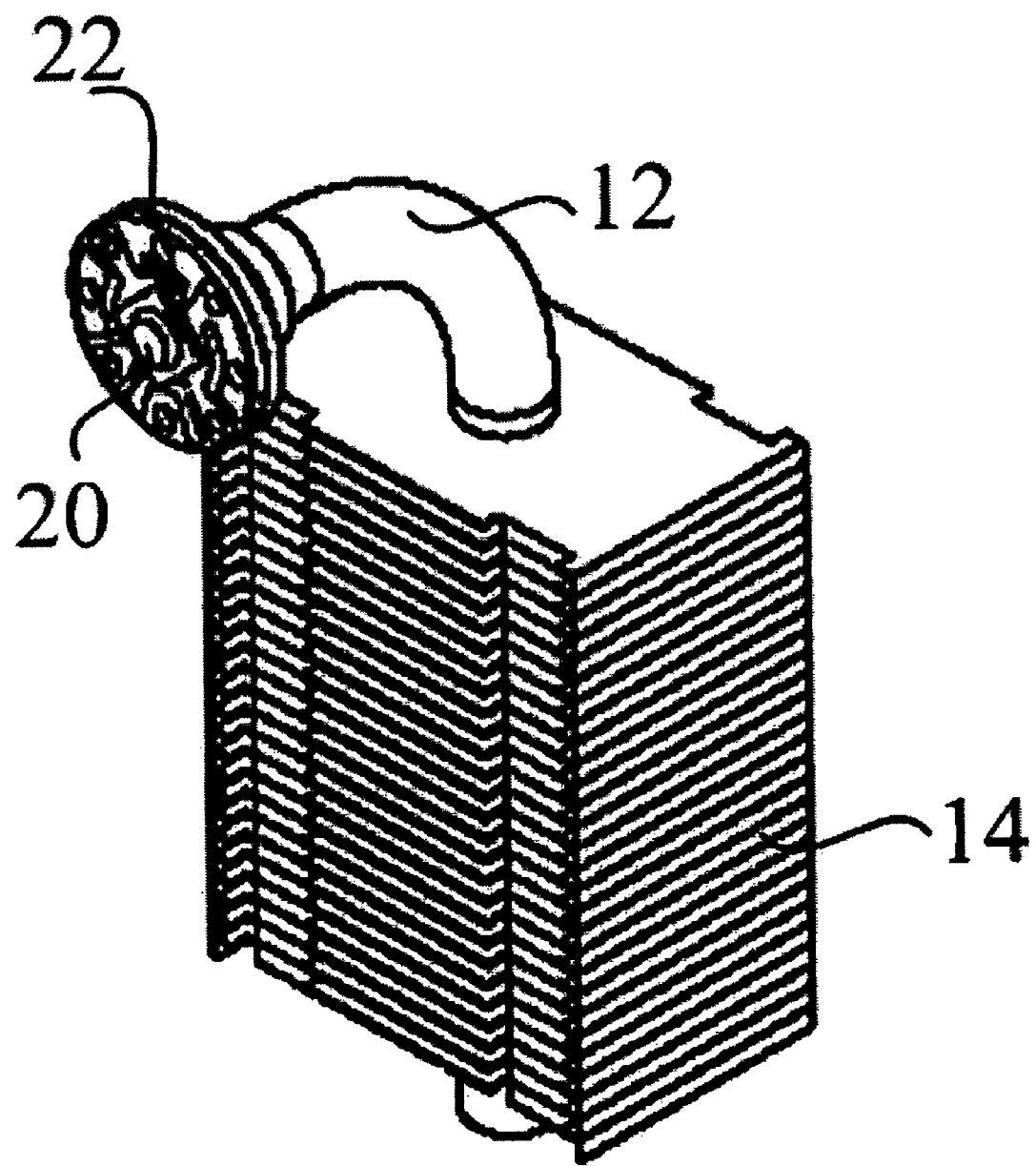
Figure 6:
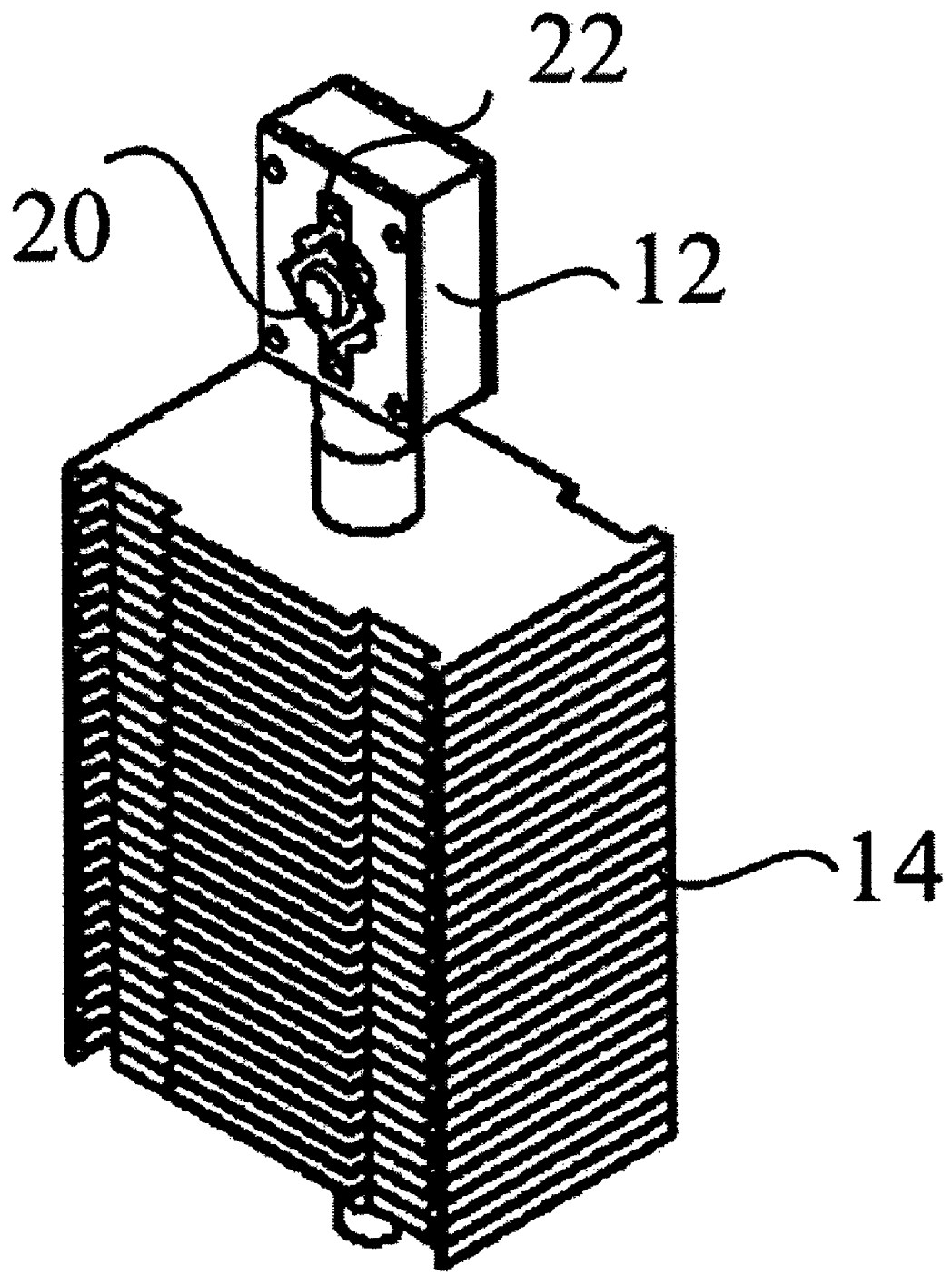
Figure 7:
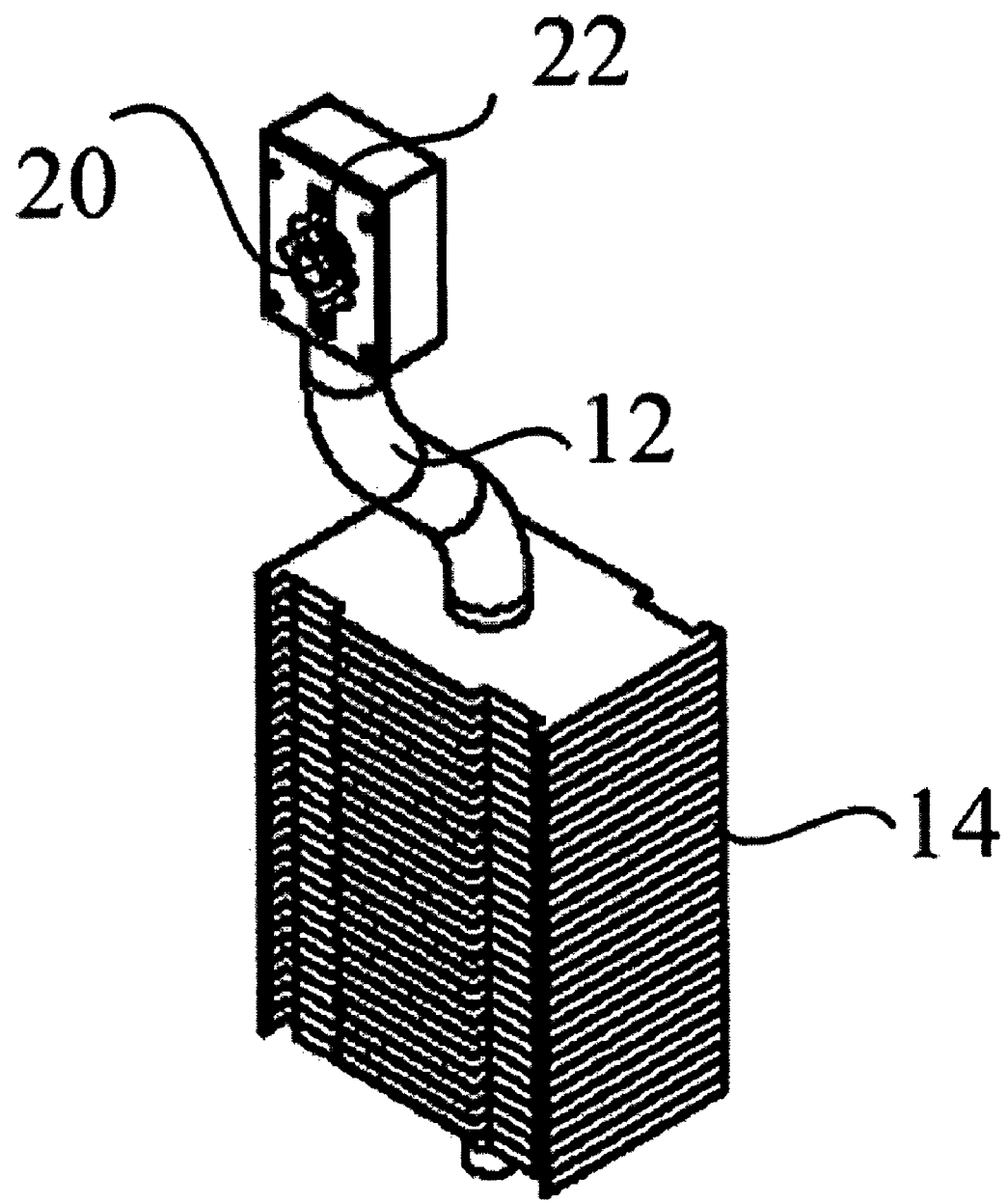

FIG. 5, FIG. 6, and FIG. 7 are diagrams showing many specifications of the light-emitting apparatus according to the invention.

DETAILED DESCRIPTION OF THE INVENTION

The present invention provides a high-power light-emitting apparatus with a high heat-dissipating efficiency for preventing the light-emitting efficiency and the product life of the high-power light-emitting diode chip from decreasing due to the exceedingly high temperature of the P-N junction. Furthermore, the light-emitting apparatus, according to the invention, has a system-in-package structure for integrating the semiconductor light-emitting module of a first level package with the high-efficiency heat-dissipating module of a second-level assembly into an independent, integrated light-emitting device having a heat-dissipating function.

Figure 1A:
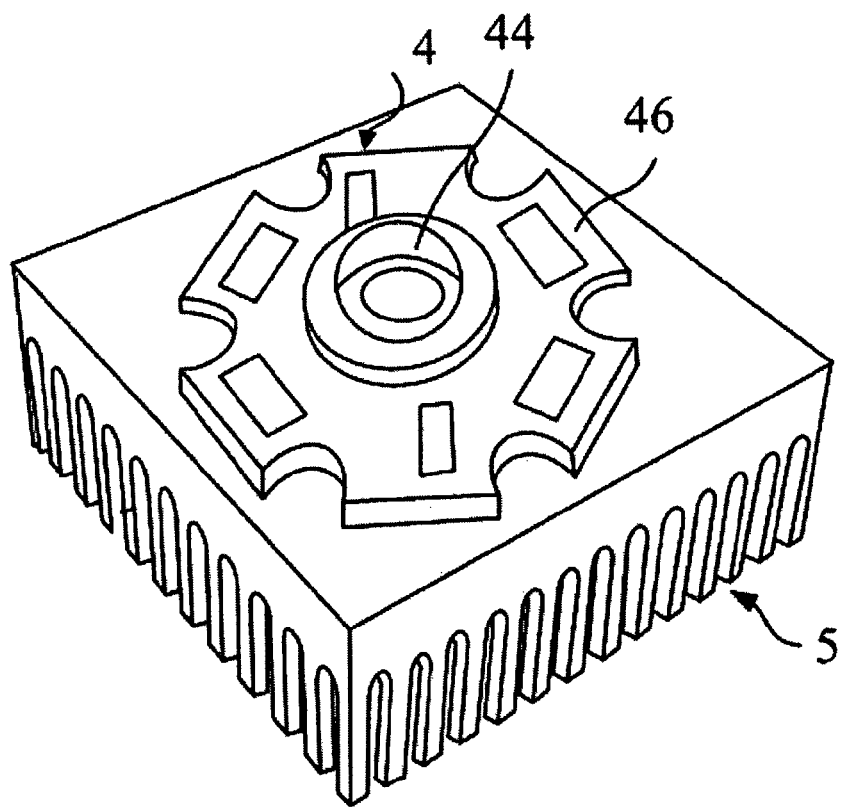
FIG. 1A is a schematic diagram of a light-emitting apparatus having a heat-dissipating module as an independent device according to prior art.
Figure 1B:
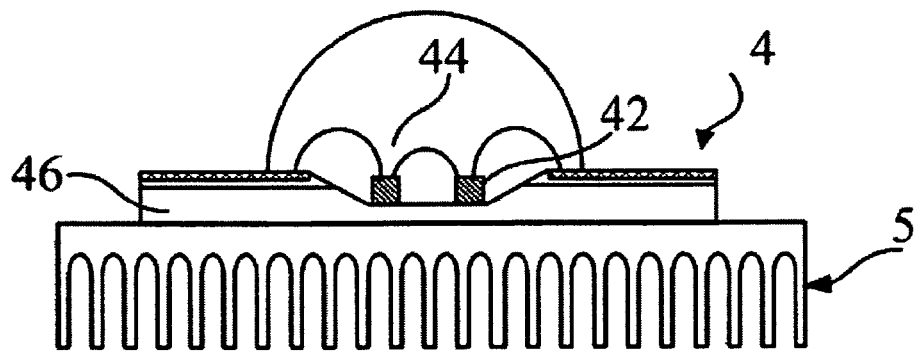
FIG. 1B is a cross-sectional view of the light-emitting apparatus having a heat-dissipating module as an independent device according to prior art.
Figure 2:
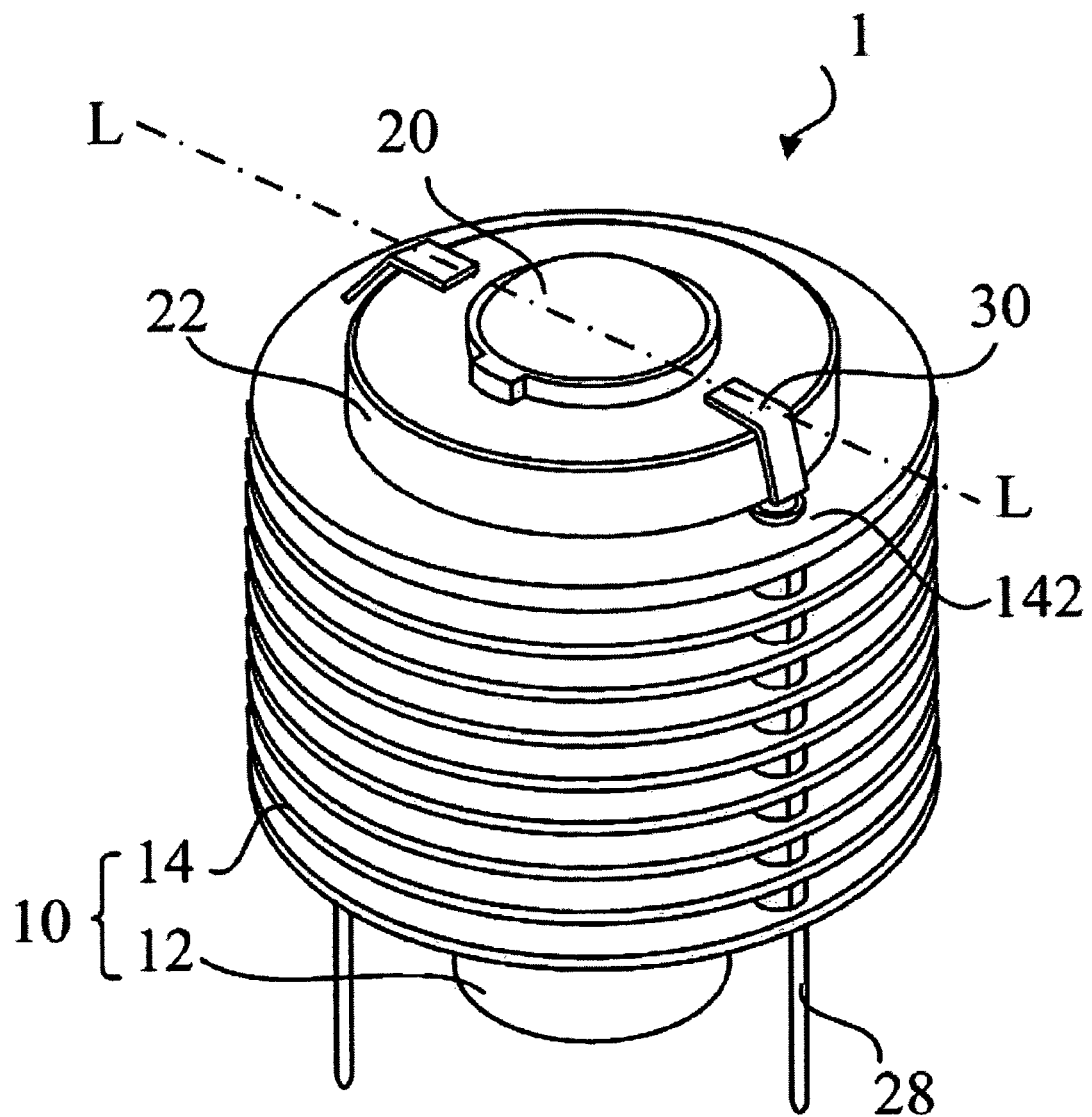
FIG. 2 is an outside perspective view of a light-emitting apparatus according to the invention.
Figure 3:
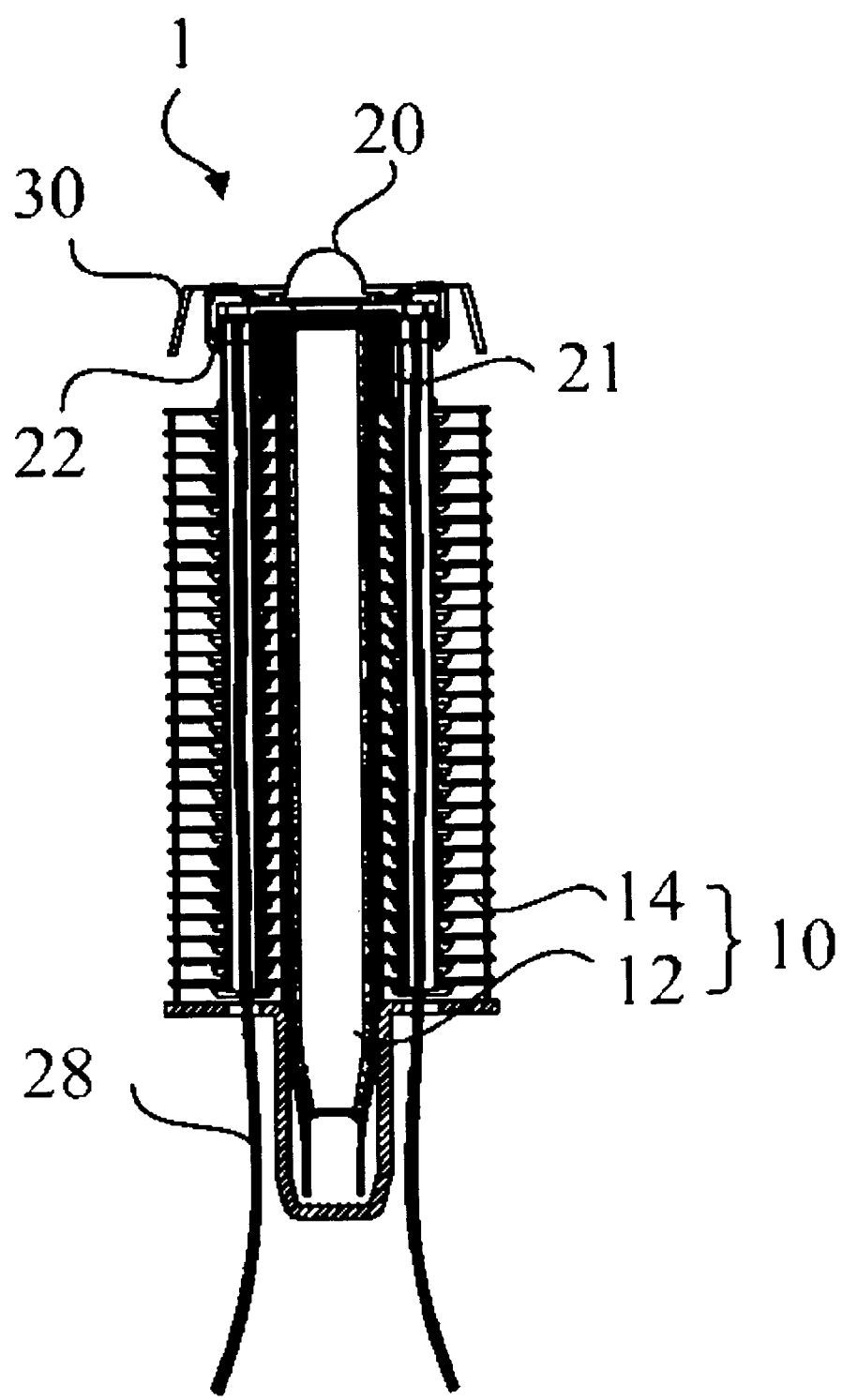
FIG. 3 is a cross-sectional view along the L-L line of the light-emitting apparatus in FIG. 2 according to the invention.

Referring to FIG. 2 and FIG. 3, FIG. 2 is an outside perspective view of a light-emitting apparatus according to the invention. FIG. 3 is a cross-sectional view along the L-L line of the light-emitting apparatus in FIG. 2 according to the invention. The light-emitting apparatus 1, according to the invention, includes a heat-conducting/dissipating module 10 and a semiconductor light-emitting module 20.

As shown in FIG. 2 and FIG. 3, the heat-conducting/dissipating module 10 includes a substantially cylindrical heat-conducting device 12 and at least one heat-dissipating fin 14. The heat-conducting device 12 has at least a flat portion mounted on one end or the circumference of the heat-conducting device 12. In one embodiment of the invention, the heat-conducting device 12 is a heat pipe, a heat column, or a material with high heat conductivity, such as a cylinder made from copper and aluminum. The length of the cylinder exceeds twice the maximum width of the at least one flat portion made by processing during the production of the cylindrical heat-conducting apparatus. The at least one heat-dissipating fin 14 is mounted on the circumference of the heat-conducting device 12, for increasing the heat-dissipating efficiency. Each of the at least one heat-dissipating fin 14 has at least one formed-through holes 142 as dissipating channels for dissipating the hot air conducted by the at least one heat-dissipating fin 14, so as to increase the heat-dissipating efficiency of the light-emitting apparatus 1 and to hide the conducting wires by passing them through the formed-through holes 142.

Figure 4:
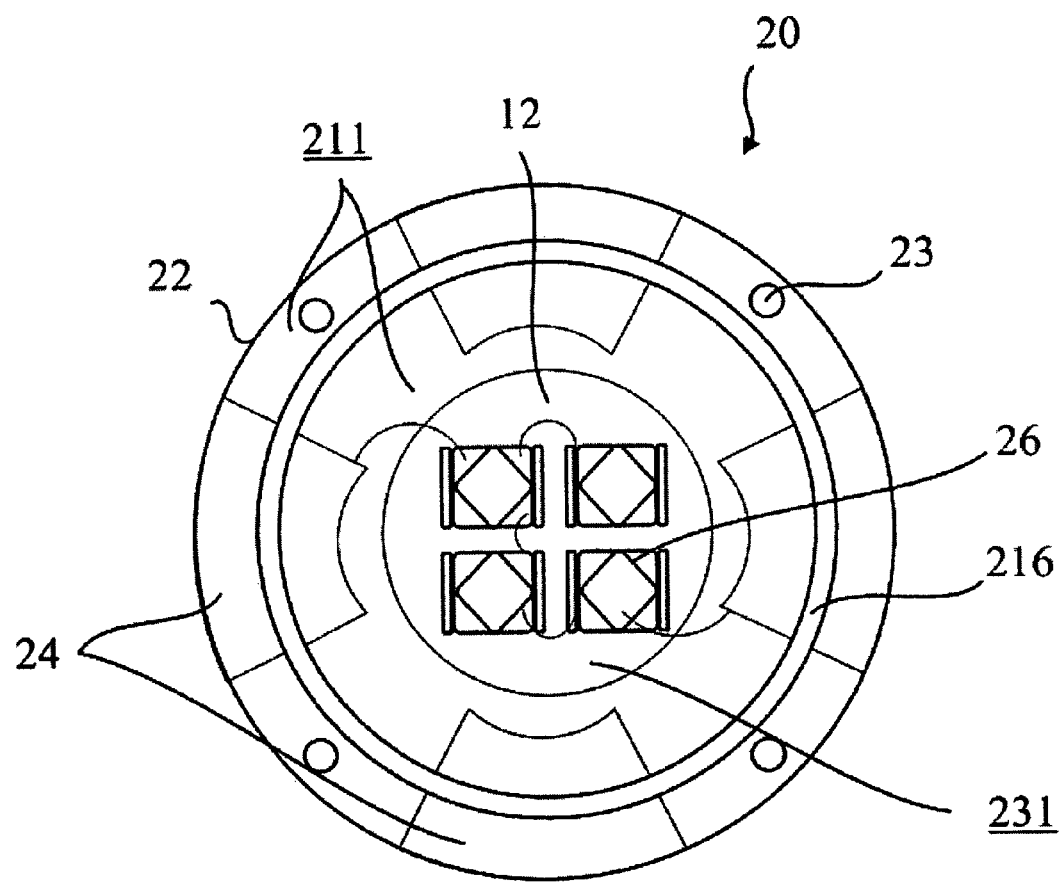
FIG. 4 is a top perspective view of the light-emitting apparatus according to a preferred embodiment of the invention.

Referring to FIG. 4, FIG. 4 is a top perspective view of the light-emitting apparatus according to a preferred embodiment of the invention. As shown in FIG. 4 and FIG. 5, the at least one semiconductor light-emitting module 20 includes a carrier 22, a plurality of exterior electrodes 24, at least one semiconductor light-emitting die 26, and at least two conducting wires 28. The carrier 22 is made from a polymeric material, a metal material, or a ceramic material, and it is mounted flatly on the at least one flat portion of the heat-conducting device 12. The carrier 22 has a plurality of formed-through holes 23 thereon for hiding the at least two conducting wires 28. The carrier 22 further includes a holder 21 disposed below the carrier 22 and locked with the heat-conducting device 12. The carrier 22 is passed through by the plurality of formed-through holes 23 and screwed onto the holder 21 by a plurality of bolts, so as to increase the engaging pressure to lower the heat resistance coefficient at the engaging interface.

The at least one semiconductor light-emitting die 26 is disposed on the carrier 22, and they are respectively electrically connected to the plurality of exterior electrodes 24. The at least two conducting wires 28 are electrically connected to the plurality of exterior electrodes 24. The at least two conducting wires 28 are capable of passing through the at least one formed-through hole 142 on the plurality of heat-dissipating fins 14 to connect to a power source or a ground.

In an embodiment of the invention, the at least one semiconductor light-emitting module further includes a package material for overlaying the at least one semiconductor light-emitting die including an optical module disposed on the carrier. The optical module is used for focusing the light emitted by the at least one semiconductor light-emitting die.

Referring to FIG. 3 again, when the light-emitting apparatus 1 shown in FIG. 3 is electrically connected to a power source, the heat generated by the at least one semiconductor light-emitting die 26 during light emission is conducted through the at least one flat portion of the heat-conducting device 12 to the at least one heat-dissipating fin 14 to dissipate heat. Because the at least one semiconductor light-emitting die according to the invention is mounted flatly and seamlessly on the at least one flat portion of the heat-conducting/dissipating module 12 through the carrier 22, and it has a distance away from the connected power source or the controlling module, so as to avoid the power source or the controlling circuit module from being directly affected by the heat energy generated by the at least one semiconductor light-emitting die 26.

As shown in FIG. 3, the light-emitting apparatus according to the invention further includes a mounting component 30 for facilitating assembly. The mounting member 30, disposed on the carrier 22, has two resilient bodies thereon. For example, if a user wants to assemble the light-emitting apparatus 1 on a formed-through aperture on a wall or a ceiling, the user can first bend the two resilient bodies respectively, so that they are parallel to the heat-conducting device 12, and then the light-emitting apparatus 1 can be mounted into the formed-through hole on the wall or the ceiling. When the light-emitting apparatus 1 is mounted into the formed-through hole, the two resilient bodies rebound to their initial state by flexibility, causing the light-emitting apparatus 1 to interlock with the formed-through hole.

Referring to FIG. 5, FIG. 6, and FIG. 7, FIG. 5, FIG. 6, and FIG. 7 are diagrams showing many specifications of the light-emitting apparatus according to the invention. From the aforementioned figures, it is known that the light-emitting apparatus according to the invention is not limited to heat-conducting devices or carriers of different types; thus, they can be modified and adapted in accordance to different application needs.

In a practical application of the invention, the light-emitting apparatus according to the invention includes at least one semiconductor light-emitting die having at least one light-emitting diode die or at least one laser diode die. The semiconductor light-emitting die can be a blue light-emitting diode or can include at least one red light-emitting diode, at least one blue light-emitting diode, and at least one green light-emitting diode, for controlling the plurality of red light-emitting diode, the plurality of blue light-emitting diode, and the plurality of green light-emitting diode, respectively, so that light-emitting diodes with different colors can constitute light with different colors by applying different proportions of light emission.

The light-emitting apparatus, according to the invention, effectively integrates the heat-conducting/dissipating module with the semiconductor light-emitting module into an independent light-emitting apparatus with a highly efficient heat-dissipating function. The light-emitting apparatus, according to the invention, mounts the semiconductor light-emitting module flatly on the flat portion of the heat-conducting device, and uses the substantially cylindrical structure of the heat-conducting device to conduct heat away to effectively decrease the junction temperature of the semiconductor light-emitting die. The heat-conducting/dissipating module is capable of effectively conducting the heat generated by the at least one semiconductor light-emitting module by using the cylindrical heat-conducting device. The heat-conducting device not only has a larger surface area compared with that according to prior art, but can also conduct the heat energy away from the semiconductor light-emitting module. The at least one heat-dissipating fins can immediately conduct the heat generated by the heat-conducting device to the surrounding air to substantially increase the heat-dissipating efficiency. By improving the heat-dissipating efficiency, the problem of decreased efficiency of the semiconductor light-emitting die caused by overheating is solved.

Accordingly, the light-emitting apparatus, according to the invention mounts the semiconductor light-emitting module flatly on the flat portion of the heat-conducting device, thus conducting heat away through the substantially cylindrical structure of the heat-conducting device to effectively lower the juncture temperature of the semiconductor light-emitting die, so that the light-emitting apparatus can be actuated to a higher watt (greater than 10 watts) to substantially increase the light-emitting efficiency.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A light-emitting apparatus, comprising:
    a heat-conducting/dissipating module, comprising:
        a substantially cylindrical heat pipe having at least one flat portion; and
        at least one heat-dissipating fin mounted on a circumference of the heat pipe; and
    at least one semiconductor light-emitting module, comprising:
        a carrier, the carrier has a bottom surface via a bottom thereof mounted flatly on the at least one flat portion of the heat pipe, wherein the carrier has a plurality of first formed through holes and a pipe accommodating hole; a plurality of exterior electrodes disposed on the carrier; at least one semiconductor light-emitting die mounted on the carrier and respectively connected to the plurality of exterior electrodes; and
        at least two conducting wires electrically connected to the plurality of exterior electrodes; and
        a holder disposed below the carrier and mounted on heat pipe, and the plurality of first formed through holes of the carrier being used for screwing the carrier onto the holder wires the pipe accommodating hole of the holder accommodating part of the heat pipe the holder having a upper surface being coplanar with the flat portion of the heat pipe, such that the bottom surface of the carrier is mounted flatly on the flat portion of the heat pipe.

2. The light-emitting apparatus of claim 1, wherein the carrier is made from a polymeric material, a metal material, or a ceramic material.

3. The light-emitting apparatus of claim 1, wherein the at least one semiconductor light-emitting module further comprises: an optical module mounted on the carrier so as to focus the light emitted by the at least one semiconductor light-emitting die.

4. The light-emitting apparatus of claim 1, wherein the heat pipe is a cylindrical device made from a material with high heat conductivity, and the height of the cylindrical device exceeds twice the maximum width of the at least one flat portion.

5. The light-emitting apparatus of claim 1, wherein the at least one flat portion is located on one end of the heat pipe.

6. The light-emitting apparatus of claim 1, wherein the at least one flat portion is located on the circumference of heat pipe.

7. The light-emitting apparatus of claim 1, wherein the at least one semiconductor light-emitting die comprises at least one light-emitting diode die or at least one laser diode die.

8. The light-emitting apparatus of claim 1, wherein the at least one semiconductor light-emitting die comprises a blue light diode die.

9. The light-emitting apparatus of claim 1, wherein the at least one semiconductor light-emitting die comprises at least one red light diode die, at least one blue light diode die, and at least one green diode die.

10. The light-emitting apparatus of claim 1, further comprising an embedding assembly mounted on the carrier, said light-emitting apparatus capable of being embedded in an object by use of the embedding assembly.

11. The light-emitting apparatus of claim 1, wherein each of the at least one heat-dissipating fin has at least one formed-through hole through which the at least two conducting wires are electrically connected to a power source or a ground.

12. A light-emitting apparatus, comprising:
    a heat-conducting/dissipating module, comprising:
        a substantially cylindrical heat pipe having at least one flat portion, the flat portion is disposed on a top flat end of the heat conducting device, wherein the extending direction of the heat conducting device is substantially parallel to the surface of the top flat end; and
        at least one heat-dissipating fin mounted on a circumference of the heat pipe; and
    at least one semiconductor light-emitting module, comprising:
        a carrier, the carrier has a bottom surface mounted flatly on the at least one flat portion of the heat pipe, wherein the carrier has a plurality of first formed through holes and a pipe accommodating hole;
        a plurality of exterior electrodes disposed on the carrier;
        at least one semiconductor light-emitting die mounted on the carrier and respectively connected to the plurality of exterior electrodes; and
        at least two conducting wires electrically connected to the plurality of exterior electrodes; and
        a holder disposed below the carrier and mounted on the heat pipe, and the plurality of first formed through holes of the carrier being used for screwing the carrier onto the holder the pipe accommodating hole of the holder accommodating part of the heat pipe the holder having a upper surface which contact with the bottom surface of the carrier such that the bottom surface of the carrier is mounted flatly on the flat portion of the heat pipe.

13. The light-emitting apparatus of claim 12, wherein the carrier is made from a polymeric material, a metal material, or a ceramic material.

14. The light-emitting apparatus of claim 12, wherein the at least one semiconductor light-emitting module further comprises: an optical module mounted on the carrier so as to focus the light emitted by the at least one semiconductor light-emitting die.

15. The light-emitting apparatus of claim 12, wherein the heat pipe is a cylindrical device made from a material with high heat conductivity, and the height of the cylindrical device exceeds twice the maximum width of the at least one flat portion.

16. The light-emitting apparatus of claim 12, wherein the at least one flat portion is located on one end of the heat pipe.

17. The light-emitting apparatus of claim 12, wherein the at least one flat portion is located on the circumference of heat pipe.

18. The light-emitting apparatus of claim 12, wherein the at least one semiconductor light-emitting die comprises at least one light-emitting diode die or at least one laser diode die.

19. The light-emitting apparatus of claim 12, wherein the at least one semiconductor light-emitting die comprises a blue light diode die.

20. The light-emitting apparatus of claim 12, wherein the at least one semiconductor light-emitting die comprises at least one red light diode die, at least one blue light diode die, and at least one green diode die.

21. The light-emitting apparatus of claim 12, further comprising an embedding assembly mounted on the carrier, said light-emitting apparatus capable of being embedded in an object by use of the embedding assembly.

22. The light-emitting apparatus of claim 12, wherein each of the at least one heat-dissipating fin has at least one formed-through hole through which the at least two conducting wires are electrically connected to a power source or a ground.

* * * * *